(12) United States Patent
Brown et al.

(10) Patent No.: US 6,614,124 B1
(45) Date of Patent: Sep. 2, 2003

(54) SIMPLE 4T STATIC RAM CELL FOR LOW POWER CMOS APPLICATIONS

(75) Inventors: Jeffrey Scott Brown, Middlesex, VT (US); Chung Hon Lam, Williston, VT (US); Randy William Mann, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 30 days.

(21) Appl. No.: 09/724,083

(22) Filed: Nov. 28, 2000

(51) Int. Cl.[7] .............................................. H01L 27/11
(52) U.S. Cl. .................................. 257/903; 257/29.098
(58) Field of Search .............................. 257/903, 907, 257/909, 904, 296, 297, 293, 368, 29.007, 29.132, 29.133, 29.169, 29.255, 29.263, 27.098; 438/381, 382, 383, 384, 385; 365/154, 156

(56) References Cited

U.S. PATENT DOCUMENTS

| | | |
|---|---|---|
| 3,949,383 A | 4/1976 | Askin et al. |
| 3,969,708 A | 7/1976 | Sonoda |
| 4,023,149 A | 5/1977 | Bormann et al. |
| 4,112,511 A | 9/1978 | Heald |
| 4,796,227 A | 1/1989 | Lyon et al. |
| 5,020,028 A | 5/1991 | Wanlass |
| 5,475,633 A | 12/1995 | Mehalel |
| 5,572,461 A | 11/1996 | Gonzalez |
| 5,635,731 A * | 6/1997 | Ashida .......................... 257/67 |
| 5,665,629 A | 9/1997 | Chen et al. |
| 5,751,044 A | 5/1998 | Lee |
| 5,757,083 A * | 5/1998 | Yang .......................... 257/369 |
| 5,781,468 A | 7/1998 | Matsuo et al. |
| 5,801,396 A * | 9/1998 | Chan et al. .................. 257/369 |
| 5,804,477 A * | 9/1998 | Lien .......................... 438/210 |
| 5,821,136 A * | 10/1998 | Chan et al. .................. 438/158 |
| 5,881,010 A | 3/1999 | Artieri |
| 5,907,175 A | 5/1999 | Klein |
| 5,907,502 A * | 5/1999 | Kim .......................... 365/156 |
| 5,995,411 A | 11/1999 | Roberts |
| 6,011,726 A | 1/2000 | Batson et al. |
| 6,043,540 A | 3/2000 | Matsui et al. |
| 6,044,011 A | 3/2000 | Marr et al. |
| 6,348,806 B1 * | 2/2002 | Okandan et al. ............ 324/763 |
| 6,370,052 B1 * | 4/2002 | Hsu et al. ...................... 365/49 |
| 6,442,060 B1 * | 8/2002 | Leung et al. ................ 365/154 |

FOREIGN PATENT DOCUMENTS

JP 2000-124333 A * 4/2000 ....... H01L/21/8244

OTHER PUBLICATIONS

"A 1.9um2 Loadless CMOS Four–Transistor SRAM Cell in a 0.18–um Logic Technology", by K. Noda, et al., Silicon Systems Research Laboratories, NEC Corporation, pp. 22.8.1—22.8.4.

* cited by examiner

*Primary Examiner*—Olik Chaudhuri
*Assistant Examiner*—Brook Kebede
(74) *Attorney, Agent, or Firm*—Scully, Scott, Murphy & Presser; William D. Sabo, Esq.

(57) ABSTRACT

An SRAM memory cell device comprises wordline and bitline inputs for enabling read/write access to memory cell contents, and, a diffusion region for maintaining a voltage to preserve memory cell content when the cell is not being accessed. The device further comprises a transistor device having a gate input for receiving a wordline voltage to turn off the transistor device when not performing memory cell read/write access; and, a gate oxide layer formed under the transistor device gate exhibiting resistance property for leaking current therethrough when the wordline voltage is applied to the gate input and the transistor device is off. The diffusion region receives voltage derived from the wordline voltage applied to said gate input to enable retention of said memory cell content in the absence of applied bitline voltage to thereby reduce power consumption.

3 Claims, 6 Drawing Sheets

Bit lines can be kept low or at Vdd/2.

Requires bit lines to be kept high to allow PFETs to act as a resistor by Ioff Ikg.

Bit lines can be kept low or at Vdd/2.

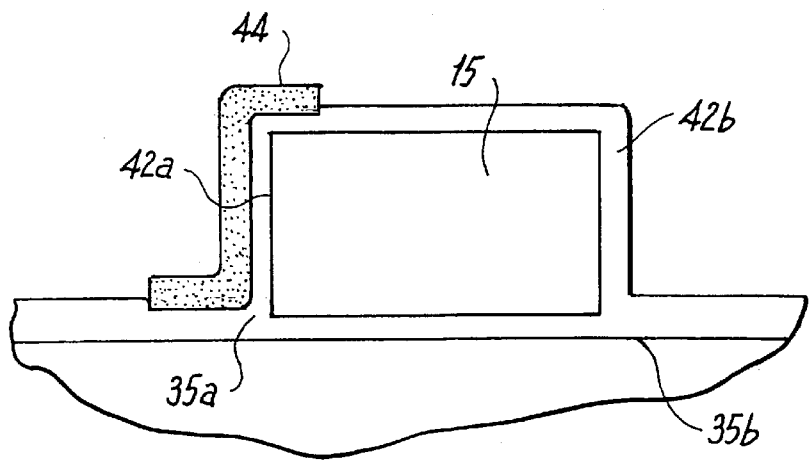
Figure 4(a)
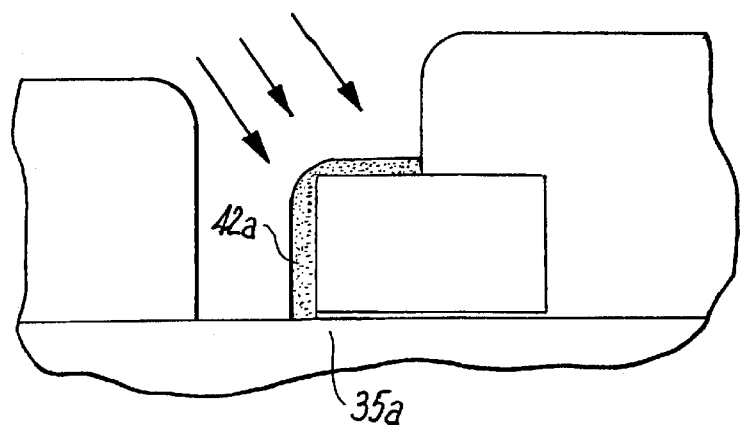
Figure 4(b)
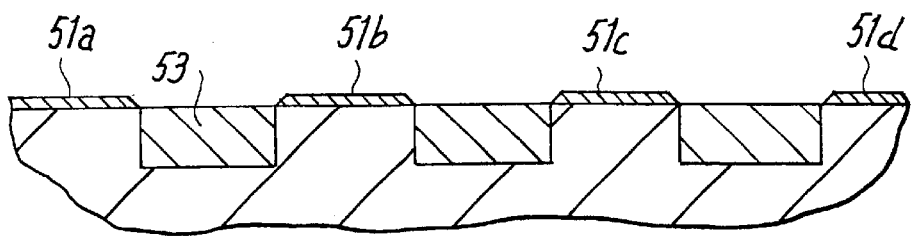
Figure 4(c)(1)

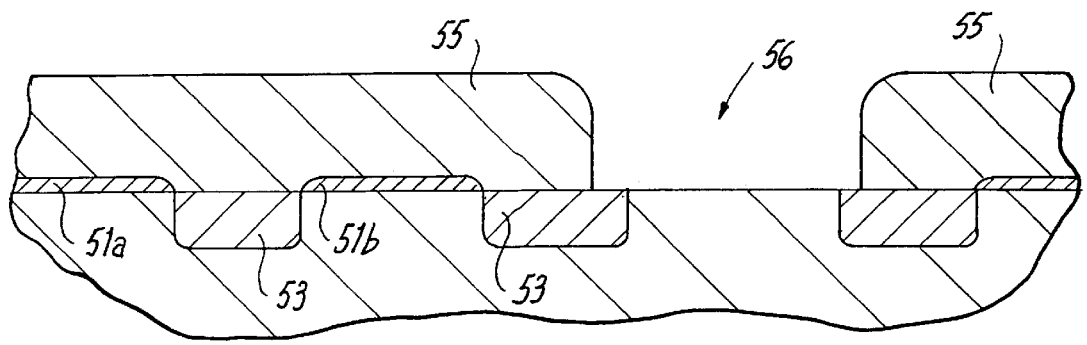
Figure 4(c)(2)
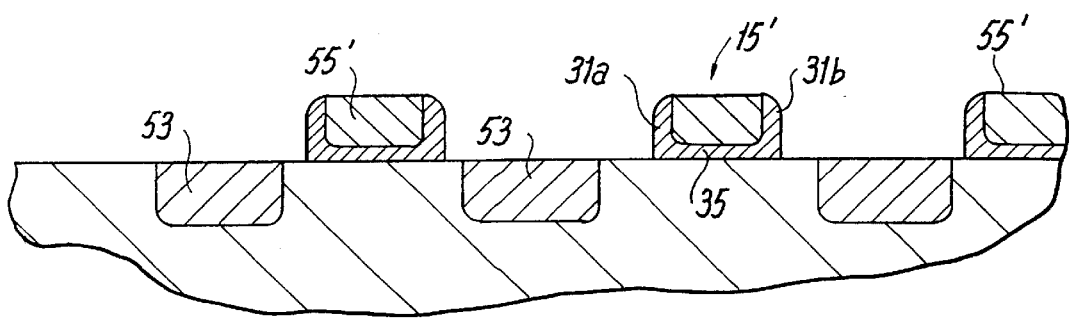
Figure 4(c)(3)
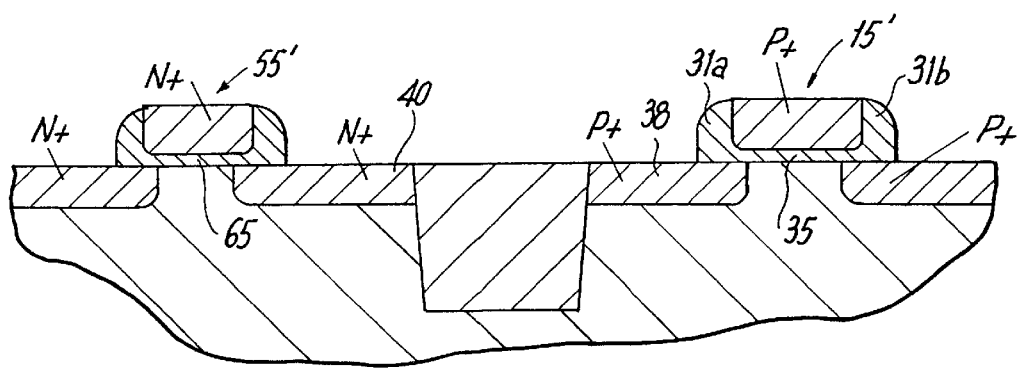
Figure 4(c)(4)

SIMPLE 4T STATIC RAM CELL FOR LOW POWER CMOS APPLICATIONS

BACKGROUND OF THE INVENTION

1. Field of the Invention

This invention relates generally to semiconductor devices, and more specifically, to an improved 4T static RAM cell for low power CMOS applications.

2. Discussion of the Prior Art

FIG. 1(a) illustrates a schematic of a 4T SRAM cell 10 according to the prior art. In the prior art SRAM cell 10, a PFET transistor 15 operating under control of the wordline (W/L) conducts the bitline voltage to the internal node 18 of the cell comprising NFET transistor 20a, 20b in a cross-coupled latch configuration. That is, when the W/L gate goes low for read applications, the low internal node within the cell pulls one of the two bitlines low through the W/L device and pull-down transistors, e.g., 15 and 20a. When writing data, the bitline (B/L) voltage is conducted to the internal nodes 18, 19. Operations regarding writing and reading of data are well known to skilled artisans. It is the case that, in the prior art 4T SRAM cell 10, the bit lines additionally function to remain high (except in write or read applications) to allow each PFETs to act as a resistor by virtue of the leakage current ($I_{off}$ leakage) provided by the PFET 15 when turned off (wordline is high). That is, the voltage at the internal node 18 is maintained by the high B/L when PFET 15 is turned off. In view of FIG. 1(a), it is understood that one of the internal nodes is going to be high 18, the other internal node will be low 19 and that constitutes either a logic one (1) or zero (0) depending on the predetermined design convention. The device of FIG. 1(a) is described in greater detail in a reference entitled "A 1.9 $\mu m^2$ Loadless CMOS Four-Transistor SRAM Cell in a 0.18-$\mu m$ Logic Technology" to K. Noda, K. Matsui, et al. I.E.D.M. 1998, pp. 643–646 which illustrates how the 4T cell may be designed where the internal node can be pulled up by the off current leakage of the wordline PFET only when the bit lines B/L are kept precharged high. The requirement that all the array B/Ls remain high for maintaining the state of the 4T SRAM cell is undesirable for low power CMOS applications. FIG. 5(a) is a further schematic depiction of the prior art 4T SRAM cell of FIG. 1(a) which illustrates the reliance on PFET $I_{off}$ resistances R1 and R2 from the B/L's precharged to a high voltage to the internal nodes 18 and 19.

It would thus be highly desirable to provide a 4T SRAM cell that does not require the bitline to remain at a high level, thus enabling reduction of power consumption requirements for the SRAM cell.

It would further be highly desirable to provide a 4T SRAM cell having a PFET gate oxide layer connecting the wordline that exhibits a resistance property when a wordline (W/L) voltage is applied, the gate oxide layer conducting leakage current for biasing an internal node of the SRAM cell in order to maintain the static cell contents.

Furthermore, it would be highly desirable to implement in a CMOS circuit generally, a gate oxide layer that exhibits a temperature independent resistance property for use in circuit applications.

SUMMARY OF THE INVENTION

It is an object of the present invention to provide in CMOS circuits generally a gate oxide layer that exhibits a nearly temperature independent resistance property. Specifically, the gate oxide layer is biased to provide a quantum tunneling leakage current that is proportional to the bias voltage applied and the thickness of the oxide layer. The amount of leakage, e.g., in picoamperes/per unit area is the measure of resistance and is proportional to the gate oxide layer thickness.

Advantageously, utilizing such a gate leakage current property, the voltage of the internal node of the 4T SRAM cell of FIG. 1 may be derived from the wordline which, for the majority of time, is always held high. Consequently, the bitline voltages may be kept low or at Vdd/2, which significantly reduces power consumption of the SRAM array in operation. Additionally, there will be a reduced chance of read disturbance associated with fluctuations in the B/L voltages.

It is contemplated that other CMOS devices may exploit the resistive property provided by such gate oxide layers.

BRIEF DESCRIPTION OF THE DRAWINGS

Further features, aspects and advantages of the apparatus and methods of the present invention will become better understood with regard to the following description, appended claims, and accompanying drawings where:

FIG. 4(a) illustrates one method for forming the lower resistance region of the gate oxide layer 35 of FIG. 3 to the desired thickness.

FIG. 4(b) illustrates a second method for forming the lower resistance region of the gate oxide layer 35 of FIG. 3 to the desired thickness.

FIGS. 4(c) (1)–4(c) (4) illustrate a third method for forming the lower resistance region of the gate oxide layer 35 of FIG. 3 to the desired thickness.

DETAILED DESCRIPTION OF THE PREFERRED EMBODIMENTS

Figure 2:
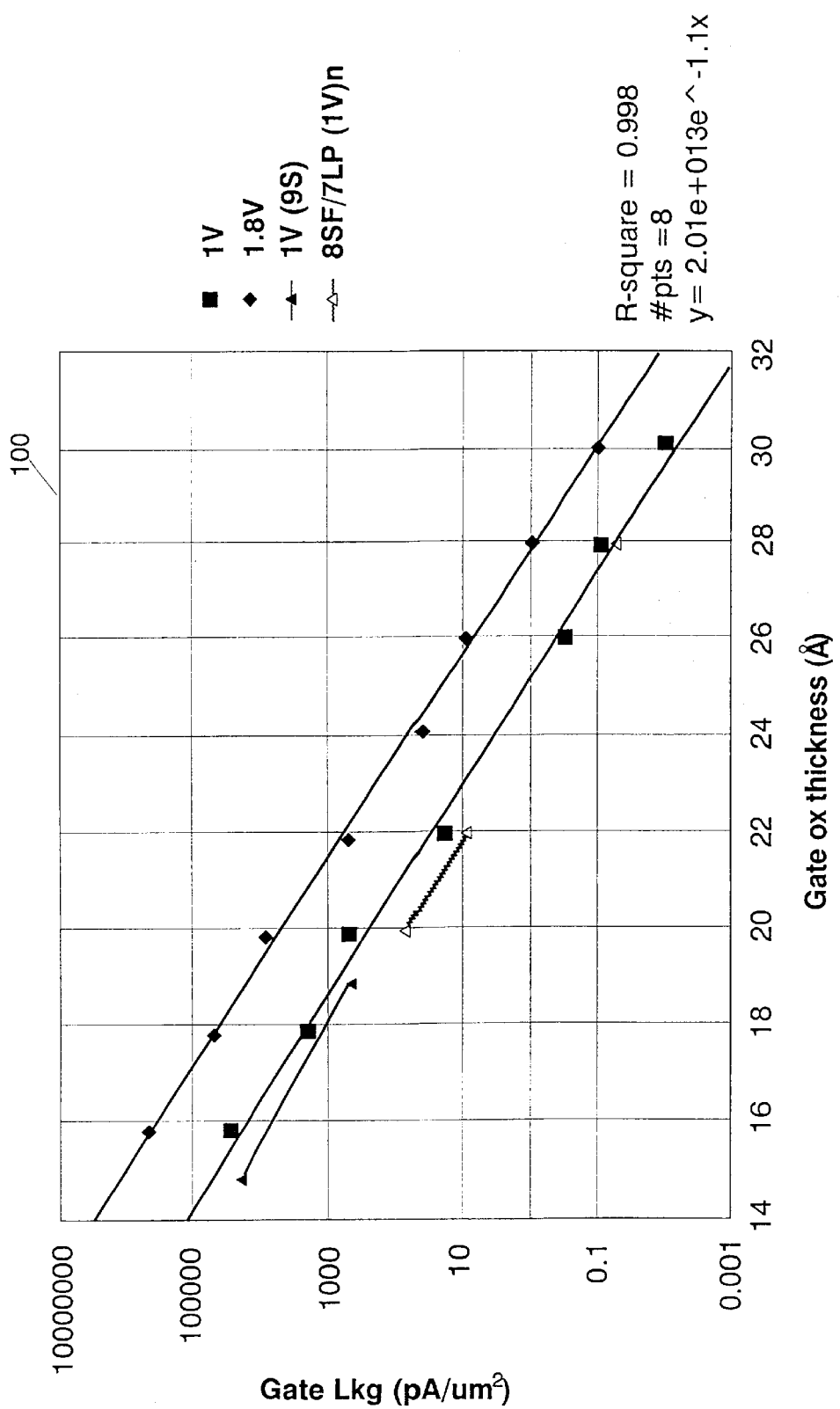
FIG. 2 is a graph of the gate leakage property versus gate oxide thickness for various levels of bias voltage.

FIG. 2 is a graph 100 of the gate leakage property versus gate oxide thickness for various levels of oxide layer bias voltage. In accordance with this graph, via a carefully fabricated gate oxide layer and applied bias voltage, a desired leakage current, e.g., in picoamperes/per unit area, may be effected. The gate oxide layer, besides functioning as a dielectric, particularly exhibits quantum mechanical tunneling phenomena when a bias is applied to function as a constant resistance device. By virtue of the quantum mechanical tunneling phenomena, it is the case that the resistance value is largely temperature independent.

Figure 1A:
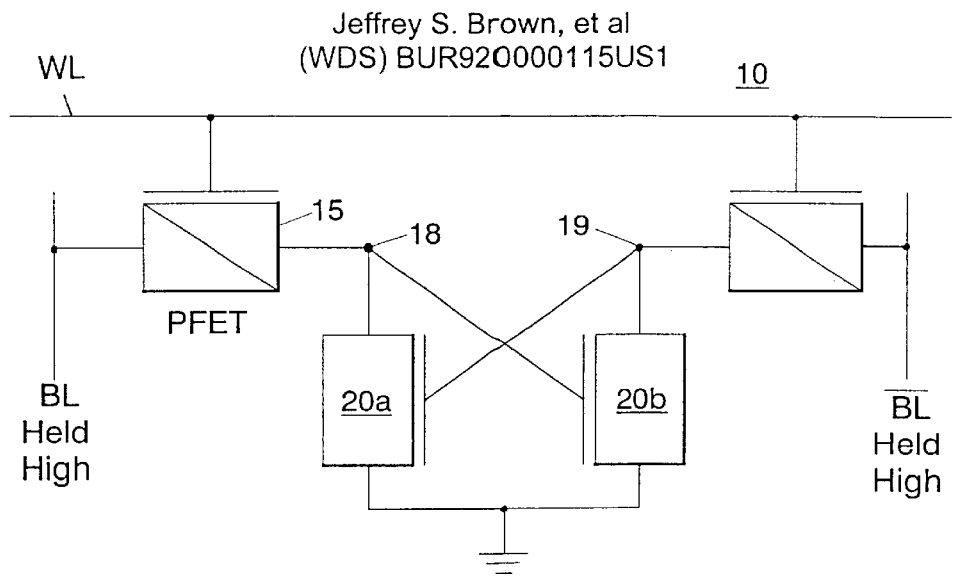
FIG. 1(a) is a prior art schematic diagram illustrating a 4T SRAM cell.
Figure 1B:
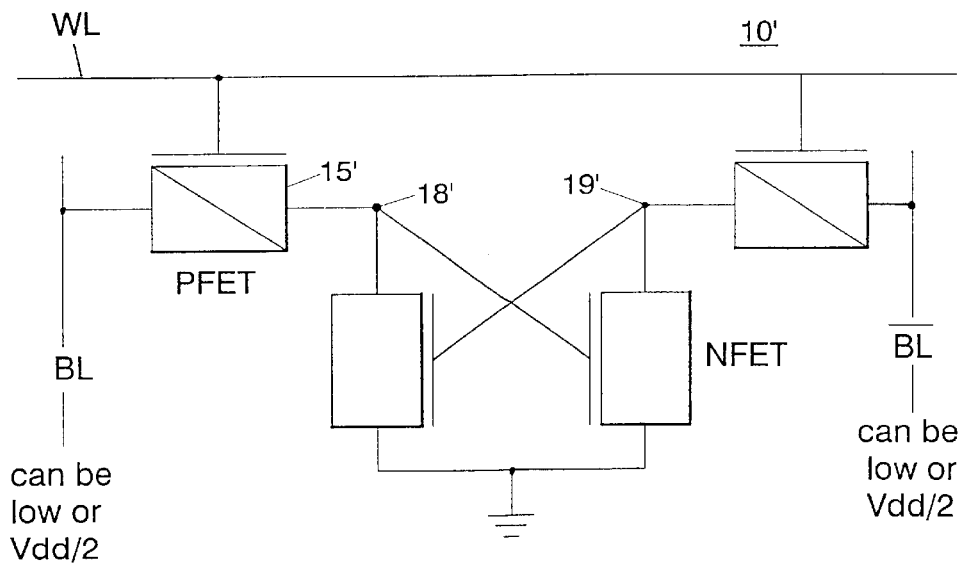
FIG. 1(b) is a schematic diagram illustrating the 4T SRAM cell according to the invention.
Figure 5A:
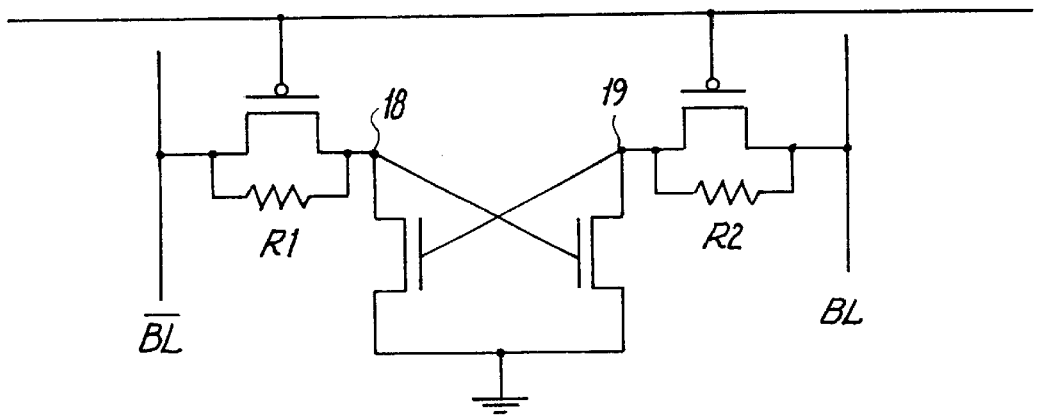
FIG. 5(a) is a further schematic depiction of the prior art 4T SRAM cell corresponding to FIG. 1(a).
Figure 5B:
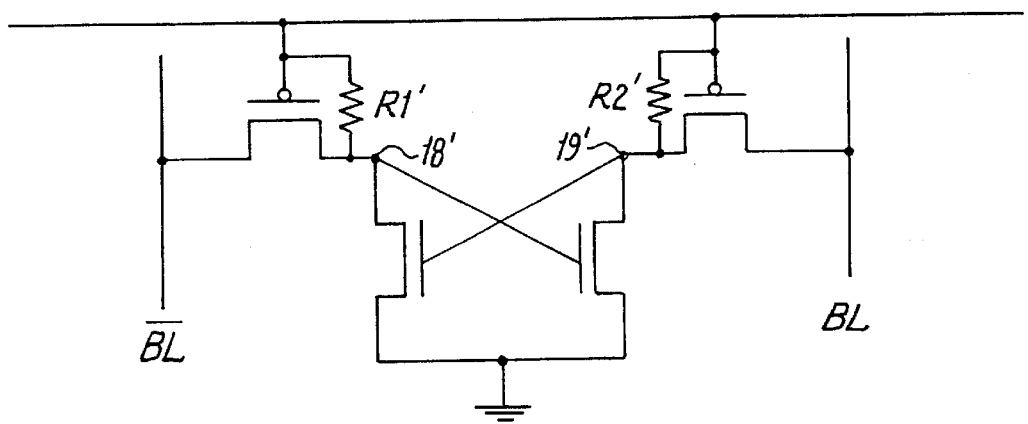
FIG. 5(b) is a further schematic depiction of the 4T SRAM cell of the invention corresponding to FIG. 1(b).

According to the invention, the 4T SRAM device 10' of FIG. 1(b) is fabricated with such a gate oxide layer that exploits this principle. Particularly, as will be described in greater detail, the wordline polysilicon PFET structure of the device 10' is fabricated with a suitably thin underlying gate oxide layer, for example, in accordance with the graph characteristics of FIG. 2. That is, beneath the W/L polysilicon layer, a gate oxide layer may be formed such that, with the suitable bias derived from the wordline W/L (which, as mentioned, is generally maintained at a high level), enables the internal node 18' to retain a high voltage independent of the bitline B/L state. This is desirable, because, in contrast to the prior art, the bitline may now be maintained at a lower state or even float, which results in less power consumption. FIG. 5(b) is a further schematic depiction of the 4T SRAM cell of the invention corresponding to FIG. 1(b) which illustrates the reliance of gate oxide resistances R1' and R2' for biasing the internal nodes 18', 19' with a voltage derived from the worldline voltage (normally held high).

Figure 3:
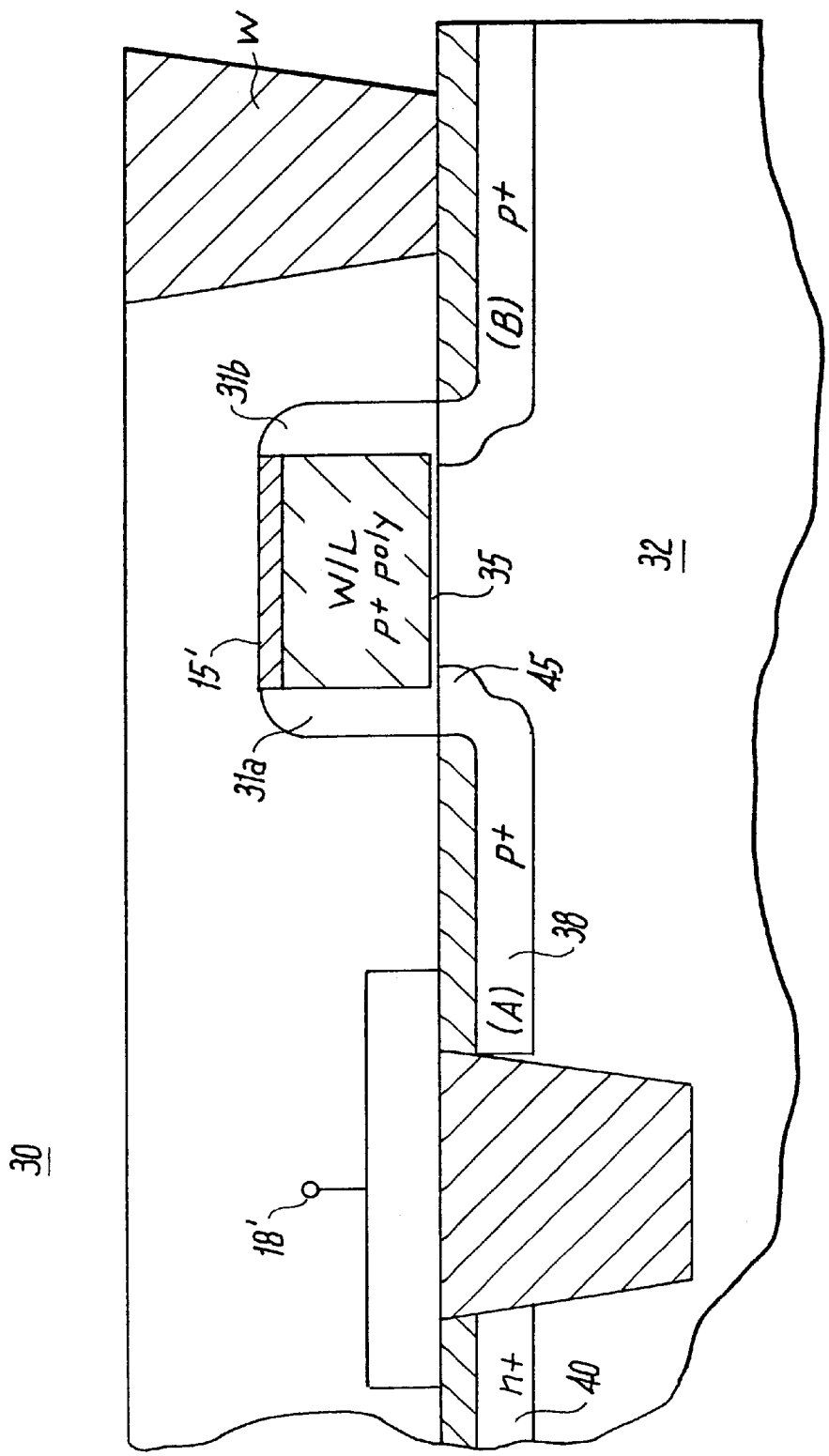
FIG. 3 illustrates the construction of a portion of the 4T SRAM cell 10 of FIG. 1.

FIG. 3 is a detailed diagram illustrating the construction of a portion 30 of the 4T SRAM cell 10' of FIG. 1(b). As shown in FIG. 3, the wordline device are PFET devices. According to the invention, an underlying gate oxide layer overlaps the diffusion region on the internal node side of the device and, that may be tailored to have some specified leakage in accordance with the graph of FIG. 2. Thus, for example the gate current may be calculated in accordance with the following equation:

$$Ig=2E13_e^{(-1.1*tox)}$$

where tox is the gate oxide layer thickness in Angstroms (Å) and Ig=gate current in $pA/\mu m^2$ at a 1.0 Volt bias.

As shown in FIG. 3, the W/L p+ polysilicon layer comprising PFET 15' with isolation spacer elements 31a,b formed therein includes an underlying gate oxide layer 35 ranging anywhere from about 1.0 Å–30.0 Å in thickness, and in accordance with current manufacturing techniques about 10.0 Å–20.0 Å in thickness. The SRAM cell portion 30 shown in FIG. 3 further includes a PFET diffusion region, e.g., p+ region layer 38, which connects to a diffusion region, e.g., n+ diffusion region 40, forming the internal node 18'. According to the invention, the expected gate oxide leakage to the internal node is formed through an overlap region 45. That is, in accordance with the principles of the invention, a portion of the gate oxide layer 35 functions as a resistor element so that, with W/L bias voltage (e.g., about 0.8–2.5 volts) applied to PFET 15', leakage current results through overlap region 45 from the wordline to the diffusion 38. It should be understood that for thinner oxide layer, thermionic emission phenomena may contribute to the resulting leakage current. This leakage current restores the diffusion region 38 to the high state within the cell and obviates the need for the bit line voltage to supply current in any way to that internal node i.e., there is no current going through the bit line according to the invention.

FIG. 4(a) illustrates one method for forming a portion of the gate oxide layer 35 of FIG. 3 to the desired thickness or degree of conductivity. In the device of FIG. 4(a) there is an underlying Si region 32 having a patterned oxide layer 35. Particularly, there is grown an initial layer of sidewall oxide 42a,b surrounding the W/L gate and a nitride ($Si_3N_4$) layer 44 is applied, patterned and etched. Then, more sidewall oxide is grown on the outside to accumulate in thickness where the nitride has been etched away. In an alternative embodiment, the nitride layer 44 may be applied first, then patterned and etched before growing the sidewall oxide layers. It is known that the silicon nitride $Si_3N_4$ prevents oxidation from occurring where it remains. In each case, "bird's beaking" (thickening of oxide) at the corner 35a is prevented thus enabling increased leakage at corner 35a, i.e., the quantum mechanical (QM) tunneling will take place to the desired extent. Since the oxide layer is thicker at gate corner 35b, QM gate tunneling is prevented at that corner.

As further shown in FIG. 4(b), the oxide "resistor" region is formed by block level and implant to increase the gate leakage at this location or, by dual gate methods (FIG. 4(c)) where the W/L PFET gate oxide is intentionally thinner than the grounded source NFET in the cell. This works because the N-well region 32 is maintained at the same potential as the W/L except during read/write operations where the W/L is brought low. Therefor, the gate oxide thickness across the entire channel may be brought uniformly thin and the function is preserved.

The second method illustrated in FIG. 4(b), is to open up a region at that corner 35a where leakage current is desired with a conventional mask and implant Si or Ge or some inert material (etc. Argon) in the opened region to enhance the tunneling through the oxide, i.e., damage the sidewall oxide layer 42a and induce more leakage at that corner 35a. Preferably, given the gate oxide layer over the W/L poly, angled implants are performed to damage the oxide so that corner 35a would be the one that would leak.

A third method is a dual gate method where a thicker gate oxide is first grown to a thickness of about 35 Angstroms to 50 Angstroms, i.e., enough where there is not any significant oxide tunneling. Then, a mask is covered and exposed to open up certain regions, like at the corner of the gate where leakage is desired or the entire channel region of the W/L PFET. With the opening in the resist, the oxide is then removed, i.e., stripped down to the underlying silicon. Then, at the corner region, the resist is stripped and the oxide is regrown to the desired thickness, e.g., 10–20 Å. Then the gate is formed, i.e., polysilicon region is formed and patterned, and the process continues. This method is advantageous if the gate poly can be realigned to the same specific area where the opening was formed.

FIG. 4(c) (1) illustrates a first step of the dual gate method for forming the low resistance portion of the SRAM device. In FIG. 4(c) (1) the process includes forming one or more isolation trench regions 53 and expose the Si regions between the isolation trenches to grow a thicker oxide layers 51a, . . . ,51d. In FIG. 4(c) (2), NFET regions 55 are then patterned in the cell, and the PFET regions, e.g., region 56, are exposed. Further the oxide at regions 56 are removed, for example by an HF containing solution. The next step (not shown) involves stripping the resist and forming the thin oxide in the PFET W/L region, and further depositing the polysilicon and patterning. The results of these steps are shown in FIG. 4(c) (3) which depicts the formation of the NFET devices 55' and the PFET device 15' and illustrates the thin gate oxide layer 35 and the spacers 31a and 31b as shown in greater detail in FIG. 4(c) (4). As shown in FIG. 4(c) (4), the NFET devices 55' are formed in a thick oxide region 65 whereas the PFETS are formed in the thin oxide region 35. It is understood that the dual gate oxide methodology depicted in FIGS. 4(c) (1)–4(c) (4) are formed using a block mask and skilled artisans may avail themselves of several methods for forming two or more regions of the different gate oxide thickness.

While the invention has been particularly shown and described with respect to illustrative and preformed embodiments thereof, it will be understood by those skilled in the art that the foregoing and other changes in form and details may be made therein without departing from the spirit and scope of the invention which should be limited only by the scope of the appended claims.

Having thus described our invention, what we claim as new, and desire to secure by Letters Patent is:

1. A SRAM memory cell device, having wordline and bitline inputs for enabling read/write access to memory cell contents, and, including a diffusion region for maintaining a voltage to preserve memory cell content when said cell is not accessed, said device comprising:

a transistor device having a gate input for receiving a wordline voltage to turn off said transistor device when not performing memory cell read/write access; and, a gate oxide layer formed under said transistor device gate exhibiting resistance property for transmitting current therethrough when said wordline voltage is applied to said gate input and said transistor device is off, wherein said diffusion region receives voltage derived from said wordline voltage applied to said gate input to enable preservation of said memory cell content in the absence of applied bitline voltage to thereby reduce power consumption;

wherein said resistance property is a result of a quantum mechanical tunneling effect in said gate oxide layer;

wherein a thickness of said gate oxide layer determines an amount of leakage current; and wherein said gate oxide thickness ranges from about 1 angstrom to 30 angstroms.

2. The SRAM memory cell device as claimed in claim 1, wherein said resistance property is temperature independent.

3. The SRAM memory cell device as claimed in claim 1, wherein an amount of applied voltage to said gate input determines an amount of leakage current.

* * * * *